United States Patent [19]
Woodruff

[11] Patent Number: 6,119,520
[45] Date of Patent: *Sep. 19, 2000

[54] METHOD FOR MANUFACTURING A VIBRATING BEAM ACCELEROMETER

[75] Inventor: James R. Woodruff, Redmond, Wash.

[73] Assignee: AlliedSignal, Morristown, N.J.

[*] Notice: This patent is subject to a terminal disclaimer.

[21] Appl. No.: 09/281,755

[22] Filed: Mar. 30, 1999

Related U.S. Application Data

[60] Division of application No. 08/735,299, Oct. 22, 1996, Pat. No. 5,948,981, which is a continuation-in-part of application No. 08/651,927, May 21, 1996.

[51] Int. Cl.[7] ...................................................... G01P 15/10
[52] U.S. Cl. ............................................. 73/514.29; 438/52
[58] Field of Search ........................... 73/514.29, 862.59, 73/514.16, DIG. 1; 216/2; 438/52

[56] References Cited

U.S. PATENT DOCUMENTS 4,901,586   2/1990   Blake et al. ......................... 73/514.29

*Primary Examiner*—John E. Chapman

[57] ABSTRACT

The method of the present invention includes forming a frame and a proof mass suspended from the frame by one or more flexures, and including within a thin active layer one or more vibratory force transducers suitably coupled to the proof mass for detecting a force applied to the proof mass. According to the present invention, an insulating layer, such as silicon oxide, is formed between the substrate and the active layer to insulate the active layer from the substrate. Providing a separate insulating layer between the substrate and active layer improves the electrical insulation between the proof mass and the transducers, which allows for effective operation over a wide range of temperatures.

16 Claims, 5 Drawing Sheets

METHOD FOR MANUFACTURING A VIBRATING BEAM ACCELEROMETER

CROSS-REFERENCE TO RELATED APPLICATIONS

The present invention is a divisional of application Ser. No. 08/735,299, filed Oct. 22, 1996 now U.S. Pat. No. 5,948,981 which is a continuation-in-part of application Ser. No. 08/651,927, filed May 21, 1996.

BACKGROUND OF THE INVENTION

The present invention relates generally to the detection and measurement of forces and more particularly to an improved accelerometer incorporating one or more vibrating force transducers for measuring the force applied to a proof mass. The present invention also relates to a method for manufacturing the accelerometer.

A widely used technique for force detection and measurement employs a mechanical resonator having a frequency of vibration proportional to the force applied. In one such mechanical resonator, one or more elongate beams are coupled between an instrument frame and a proof mass suspended by a flexure. An electrostatic, electromagnetic or piezoelectric force is applied to the beams to cause them to vibrate transversely at a resonant frequency. The mechanical resonator is designed so that force applied to the proof mass along a fixed axis will cause tension or compression of the beams, which varies the frequency of the vibrating beams. The force applied to the proof mass is quantified by measuring the change in vibration frequency of the beams.

Recently, vibratory force transducers have been fabricated from a body of semiconductor material, such as silicon, by micromachining techniques. For example, one micromachining technique involves masking a body of silicon in a desired pattern, and then deep etching the silicon to remove portions thereof. The resulting three-dimensional silicon structure functions as a miniature mechanical resonator device, such as an accelerometer that includes a proof mass suspended by a flexure. Existing techniques for manufacturing these miniature devices are described in U.S. Pat. Nos. 5,006,487, "Method of Making an Electrostatic Silicon Accelerometer" and 4,945,765 "Silicon Micromachined Accelerometer", the complete disclosures of which are incorporated herein by reference.

The present invention is particularly concerned with accelerometers having vibrating beams driven by electrostatic forces. In one method of fabricating such miniature accelerometers, a thin layer of silicon, on the order of about 20 micrometers thick, is epitaxially grown on a planar surface of a silicon substrate. The epitaxial layer is etched, preferably by reactive ion etching in a suitable plasma, to form the vibrating components of one or more vibratory force transducers (i.e., vibrating beams and electrodes). The opposite surface of the substrate is etched to form a proof mass suspended from a stationary frame by one or more flexure hinge(s). While the opposite surface of the substrate is being etched, the epitaxial layer is typically held at an electric potential to prevent undesirable etching of the epitaxial layer. During operation of the transducer, the beams and the electrodes are electrically isolated from the substrate by back biasing a diode junction between the epitaxial layer and the substrate. The transducer may then be coupled to a suitable electrical circuit to provide the electrical signals required for operation. In silicon vibrating beam accelerometers, for example, the beams are capacitively coupled to the electrodes, and then both the beams and electrodes are connected to an oscillator circuit.

The above described method of manufacturing force detection devices suffers from a number of drawbacks. One such drawback is that the beams and electrodes of the vibratory force transducer(s) are often not sufficiently electrically isolated from the underlying substrate. At high operating temperatures, for example, electric charge or current may leak across the diode junction between the substrate and the epitaxial layer, thereby degrading the performance of the transducer(s). Another drawback with this method is that it is difficult to etch the substrate without etching the epitaxial layer (even when the epitaxial layer is held at an electric potential). This undesirable etching of the epitaxial layer may reduce the accuracy of the transducer.

Another drawback with many existing force detection devices, such as accelerometers, is that they often have an asymmetrical design, which may make it more difficult to incorporate the accelerometer into a system, particularly in high performance applications. For example, the proof mass flexure hinge is typically etched on the opposite surface of the substrate as the transducers. This produces an asymmetrical device in which the input axis of the accelerometer is skewed relative to a direction normal to the surface of the silicon wafer.

SUMMARY OF THE INVENTION

The present invention provides methods for detecting and measuring forces with mechanical resonators and improved methods of manufacturing these force detecting apparatus. These methods and apparatus are useful in a variety of applications, and they are particularly useful for measuring acceleration.

The present invention includes a substrate coupled to a thin active layer each comprising a semiconducting material. The substrate has a frame and a proof mass suspended from the frame by one or more flexures. The active layer includes one or more vibratory force transducers suitably coupled to the proof mass for detecting a force applied to the proof mass. According to the present invention, an insulating layer is formed between the substrate and the active layer to insulate the active layer from the substrate. Providing a separate insulating layer between the substrate and active layer improves the electrical insulation between the proof mass and the transducers, which allows for effective transducer operation over a wide range of temperatures.

In a specific configuration, the substrate and active layer are made from a silicon material, and the insulating layer comprises a thin layer (e.g., about 0.1 to 10.0 micrometers) of oxide, such as silicon oxide. The silicon oxide layer retains its insulating properties over a wide temperature range to ensure effective transducer performance at, for example, high operating temperatures on the order of above about 70° C. to 100C. In addition, the insulating layer inhibits undesirable etching of the active layer while the substrate is being etched, which improves the accuracy of the apparatus.

In a preferred configuration, the flexure hinge of the proof mass is preferably etched near or at the center of the silicon substrate that comprises the proof mass (i.e., substantially centered between the first and second surfaces of the substrate). This arrangement provides an input axis that is substantially normal to the surface of the substrate, thereby improving the alignment.

In an exemplary embodiment, the force detection apparatus comprises an accelerometer for measuring the acceleration of the stationary frame relative to the proof mass. In this embodiment, the active layer includes a pair of vibratory force transducers on either side of the proof mass. The vibratory force transducers each preferably include first and second parallel beams each having a first end portion fixed to the proof mass, a second end portion fixed to the instrument frame and a resonating portion therebetween. The transducers each further include first and second electrodes positioned adjacent to and laterally spaced from the first and second beams. An oscillating circuit is capacitively coupled to the electrodes for electrostatically vibrating the beams and for determining a magnitude of a force applied to the proof mass based on the vibration frequency of the beams.

The accelerometer of the present invention is manufactured by applying an insulating layer of silicon oxide between the silicon substrate and the active layer. Preferably, the silicon oxide layer is first deposited or grown onto substantially planar surfaces of the substrate and the active layer, and then the substrate and active layer are bonded together, e.g., with high temperatures, so that the silicon oxide layers insulate the substrate from the active layer. In a preferred configuration, portions of the silicon wafers will be removed after they have been bonded together to provide a substrate of about 300 to 700 micrometers and a relatively thin active layer of about 5 to 40 micrometers bonded thereto. The proof mass and instrument frame are then etched into the substrate and the transducers are etched, preferably with reactive ion etching, into the active layer. The insulating layer inhibits undesirable etching of the active layer while the substrate is being etched and vice versa. Forming the accelerometer components from the silicon wafers results in the transducer beams being mechanically coupled to the proof mass and the frame. Both the beams and the electrodes are then coupled to a suitable external oscillator circuit.

Other features and advantages of the invention will appear from the following description in which the preferred embodiment has been set forth in detail in conjunction with the accompanying drawings.

DESCRIPTION OF THE SPECIFIC EMBODIMENTS

Figure 1:
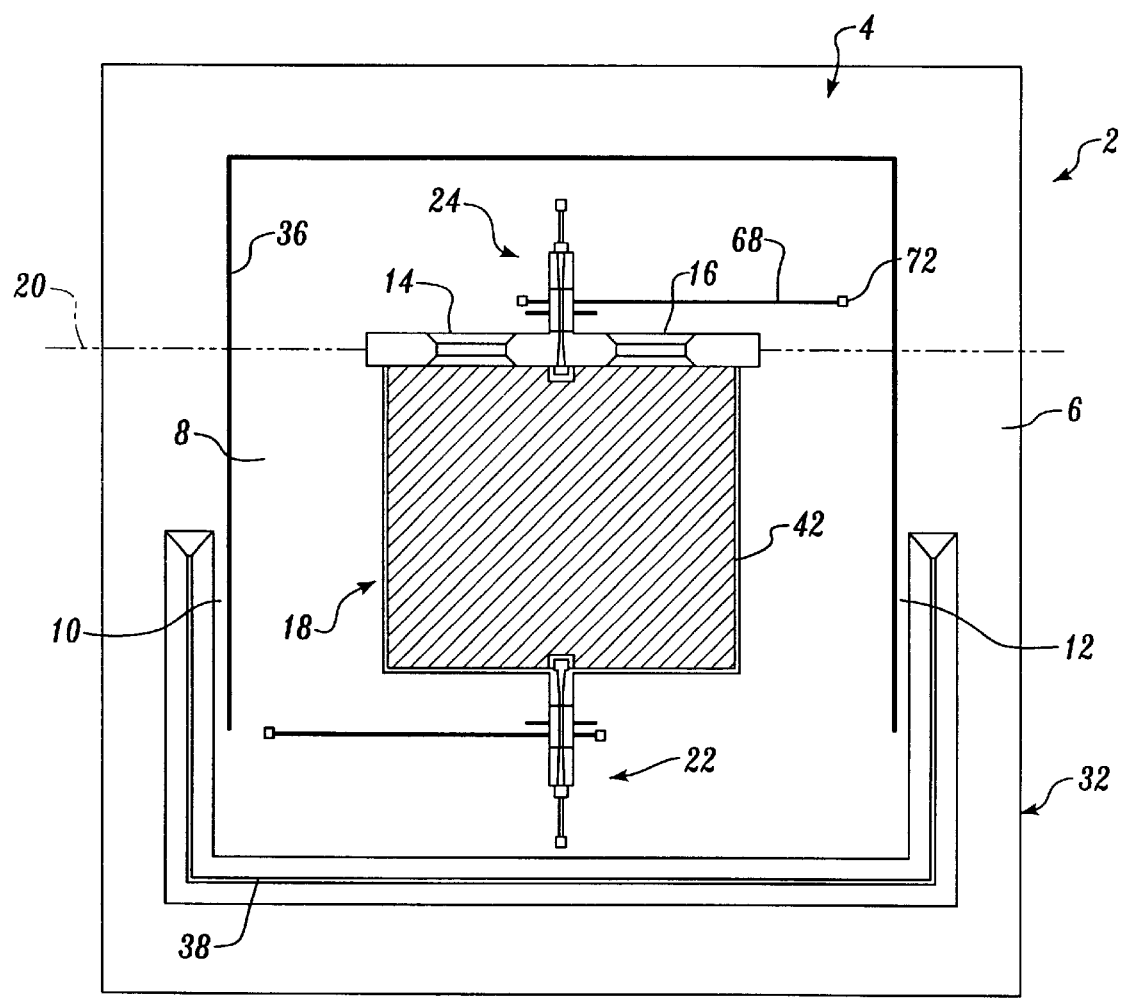
FIG. 1 is a schematic top view of a micro silicon accelerometer manufactured according to the principles of the present invention.

Referring to the figures, wherein like numerals indicate like elements, a representative force detecting system or accelerometer 2 is illustrated according to the present invention. Accelerometer 2 is a miniature structure fabricated from a body of semiconductor material by micro-machining techniques. As shown in FIG. 1, accelerometer 2 is preferably formed from a monocrystalline silicon body 4 that includes a pair of inner flexures 14, 16 supporting a proof mass 18 for movement of the proof mass 18 about a hinge axis 20 parallel to the plane of body 4. Proof mass 18 will move about hinge axis 20 in response to an applied force, such as the acceleration of the vehicle, aircraft or the like that houses accelerometer 2. Accelerometer 2 includes a pair of vibratory force transducers 22, 24 coupled to proof mass 18 and to body 4 for measuring forces applied to proof mass 18 (discussed in detail below). An oscillator circuit 30 (FIG. 6) electrostatically drives transducers 22, 24 at their resonance frequency. When a force is applied to proof mass 18, mass 18 will rotate about hinge axis 20, causing axial forces (compressive or tensile) to be applied to transducers 22, 24. The axial forces change the frequency of vibration of transducers 22, 24 and the magnitude of this change serves as a measure of the applied force.

Figure 2:
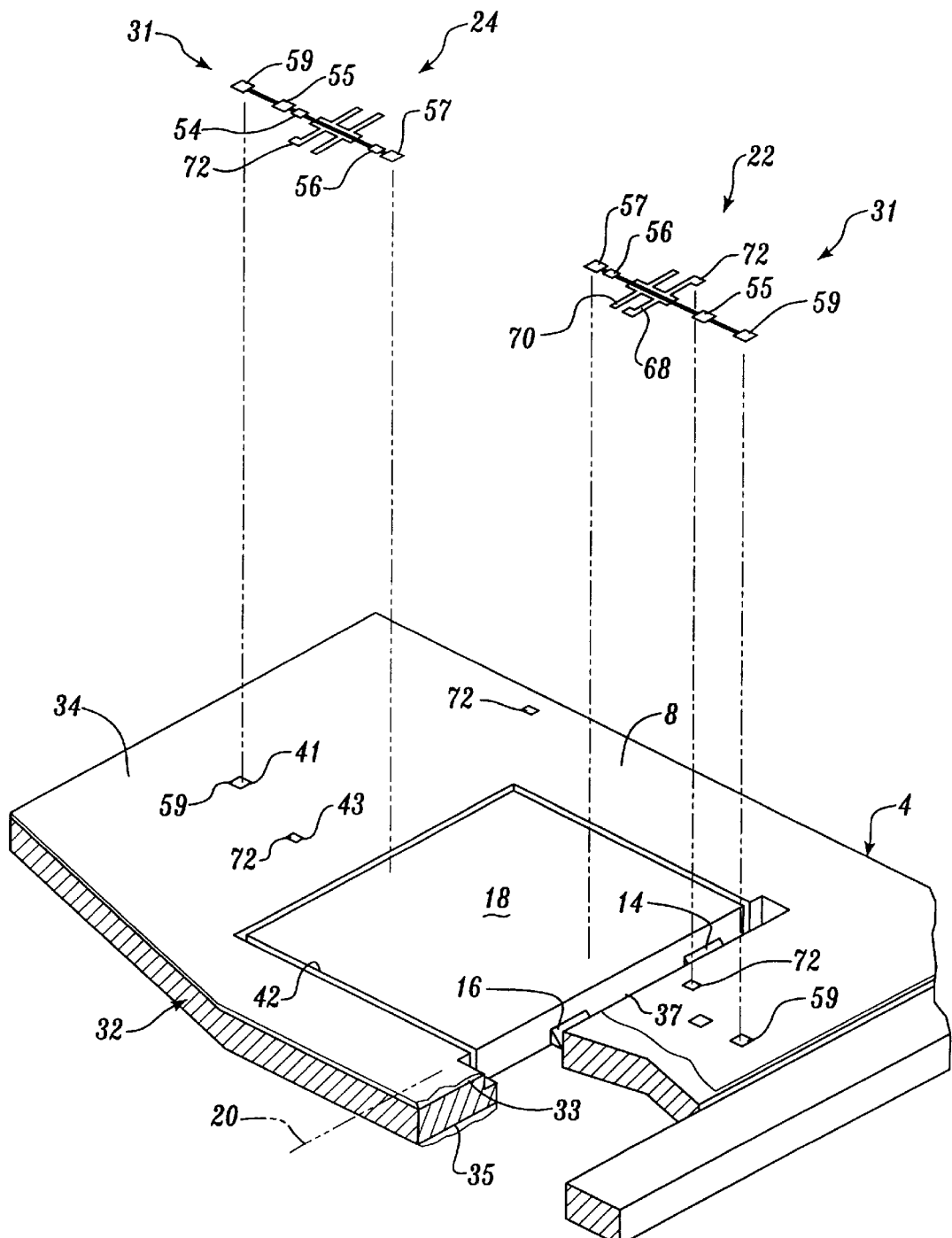
FIG. 2 is an exploded view of the accelerometer of FIG. 1.
Figure 7A:
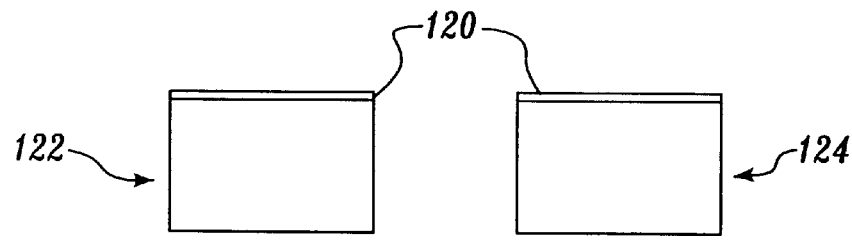
FIGS. 7A–7C are schematic views illustrating a method for manufacturing an accelerometer according to the present invention.
Figure 7B:
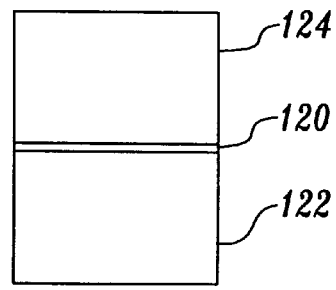
Figure 7C:
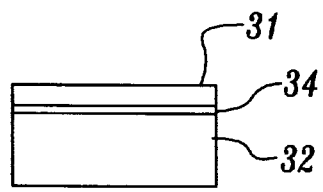

FIG. 2 schematically illustrates silicon body 4 comprising an upper silicon or active layer 31 electrically isolated from an underlying substrate 32 by an insulating layer 34 applied to substrate 32 (note that an insulating layer may also be applied to active layer 31, as shown in FIGS. 7A–7C). Insulating layer 34 preferably comprises a thin layer (e.g., about 0.1 to 10.0 micrometers) of oxide, such as silicon oxide. The silicon body 4 is usually formed by oxidizing active layer 31 and substrate 32, and then adhering the two layers together. A portion of active layer 31 will be removed to bring layer 31 to the desired thickness The silicon oxide layer 34 retains its insulating properties over a wide temperature range to ensure effective transducer performance at, for example, high operating temperatures on the order of above about 70° C. to 100C. In addition, the insulating layer 34 inhibits undesirable etching of the active layer while the substrate is being etched (as discussed in detail below).

As shown in FIG. 2, proof mass 18 is formed from substrate 32 by etching a slot 42 through substrate and suitably etching around inner flexures 14, 16. Transducer 22 and the appropriate electrical bonds 59, 72 (discussed below) for coupling transducer 22 to oscillator circuit 30 are formed on active layer 31 by suitable etching techniques, such as reactive ion etching, anisotropic etching or the like. Preferably, electrical bonds 59, 72 are directly coupled to oscillator circuit 30. If desired, the remaining portions (not shown) of active layer 31 may then be removed to minimize disturbances to the active components.

As shown in FIG. 2, inner flexures 14, 16 are preferably etched near or at the center of the silicon substrate 32 (i.e., substantially centered between upper and lower surfaces 33, 35). Preferably, flexures 14, 16 are formed by anistropically etching the flexures in a suitable etchant, such as potassium hydroxide. This arrangement provides an input axis 20 (the axis about which proof mass 18 rotates in response to an applied force) that is substantially normal to the plane of substrate 32, which reduces the skew of the input axis 20 relative to the mass of the proof mass 18. Flexures 14, 16 are preferably spaced from each other and define an effective hinge point 37 centered therebetween. Alternatively, a single flexure (not shown) may be formed at hinge point 37. Preferably, flexures 14, 16 are designed to limit S-bending. To this end, flexures 14, 16 will preferably have a relatively short length.

Referring again to FIG. 1, outer and inner frames 6, 8 are formed on substrate 32 by etching slots 36, 38 through substrate 32. Slots 36, 38 overlap each other to form flexures 10, 12 so that inner and outer frames 6, 8 are movable relative to each other. Outer frame 6 is usually coupled to a silicon cover plate (not shown), which, in turn, is typically connected to a ceramic or metal mounting plate (not shown). Since the mounting and cover plates are fabricated from different materials, they will usually have substantially different coefficients of thermal expansion when heated. This thermal mismatching may cause undesirable stresses and strains at the interface of the inner and cover plates, causing a slight distortion of outer frame 6. Flexures 10, 12 allow inner frame 8 to move relative to outer frame 6 to minimize the distortion of inner frame 8 and thereby decrease the effects of thermal mismatching on transducers 22, 24.

Figure 3:
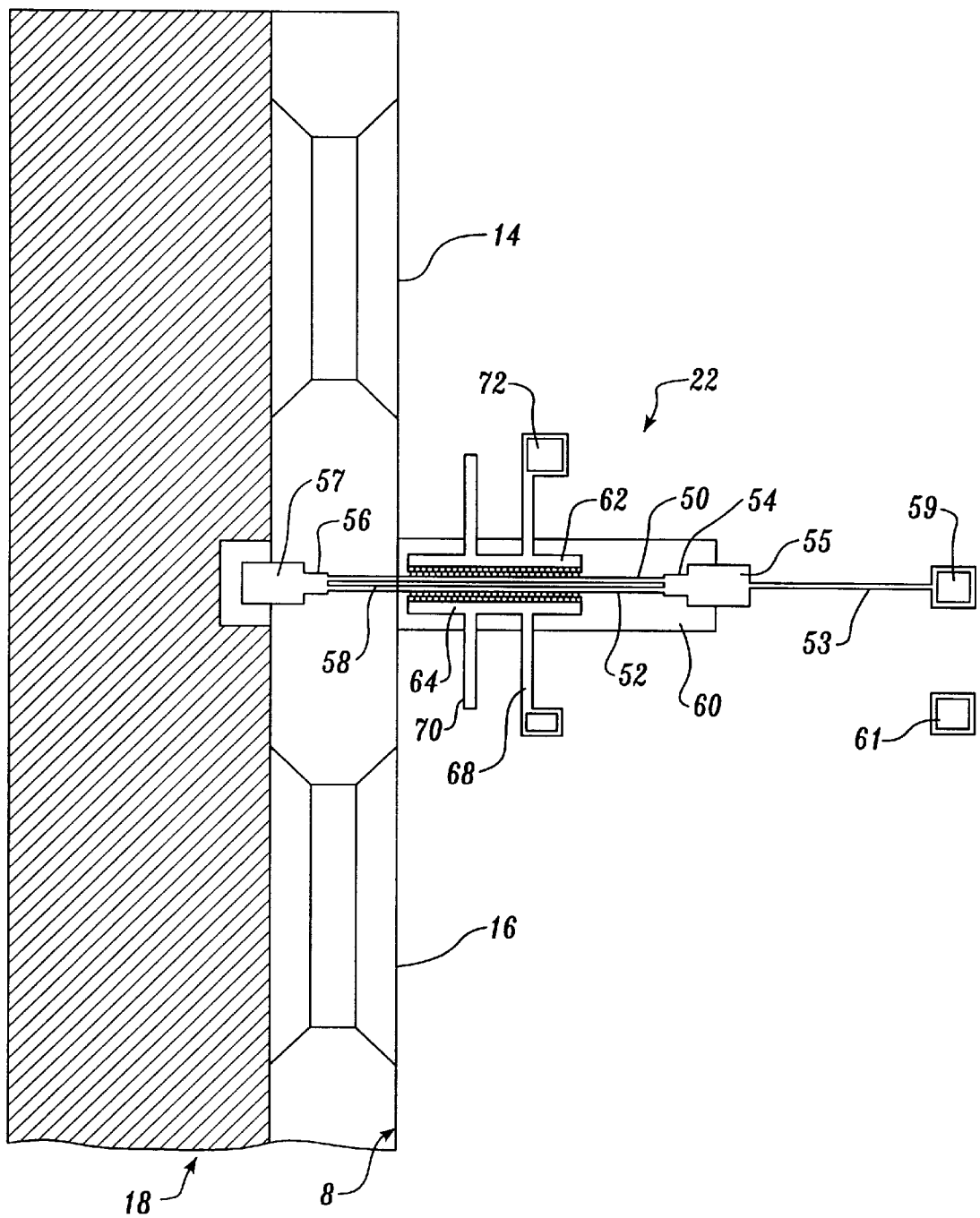
FIG. 3 is an enlarged view of a portion of the accelerometer of FIG. 1, illustrating an exemplary vibratory force transducer.
Figure 4:
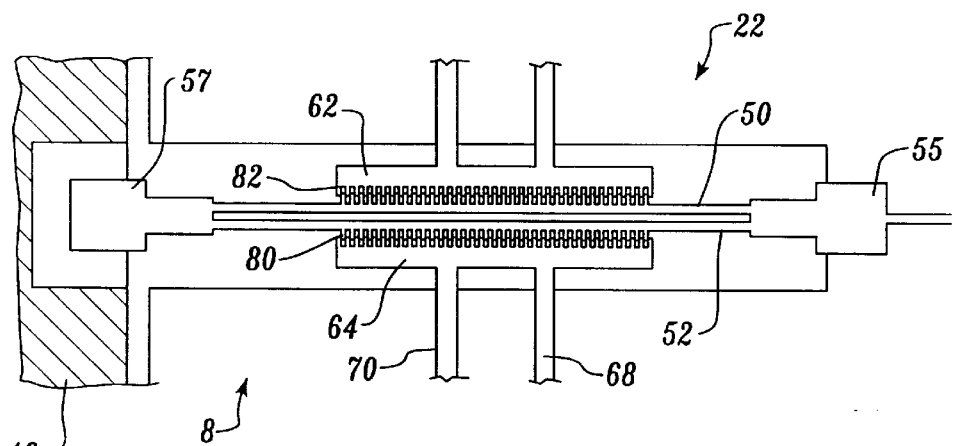
FIG. 4 is an enlarged view of the vibratory force transducer of FIG. 3.
Figure 5:
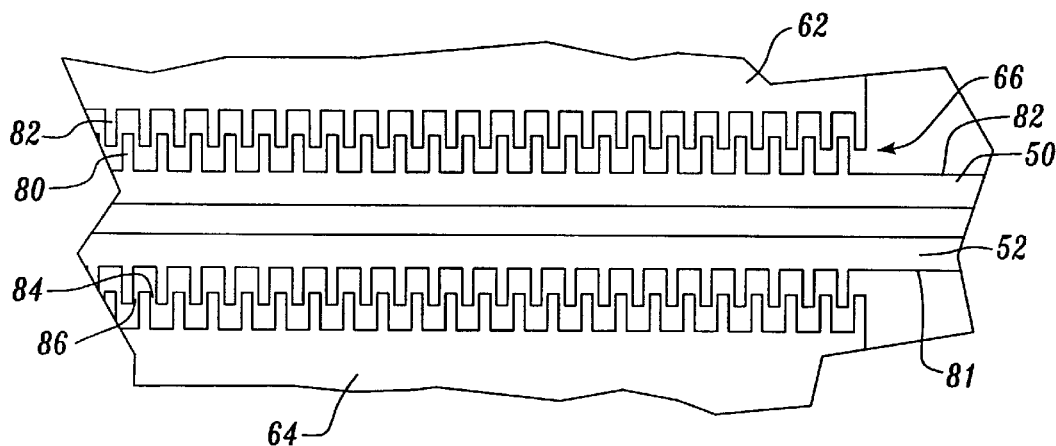
FIG. 5 is a further enlarged view of the vibratory force transducer, illustrating the intermeshed projecting fingers of the present invention.

Referring to FIGS. 3–5, one of the vibratory transducers 22 will now be described in detail. Vibratory transducer 22 comprises a pair of generally parallel beams 50, 52 coupled together at enlarged or widened end portions 54, 56 and separated from each other by a slot 58 to form a double ended tuning fork. Beams 50, 52 are formed from active silicon layer 31 and separated from substrate 32 so that the beams may be vibrated laterally relative to fixed end portions 54, 56 (discussed below). End portions 54, 56 are suitably bonded to proof mass 18 and body 4, respectively, by mounting pads 55, 57. Widened end portions 54, 56 are provided to mechanically couple the vibrating beams 50, 52 to each other. Slot 58 will usually have a width of about 10 to 30 microns and a length of about 1000 to 2000 microns. However, it will be understood that these dimensions may vary depending on the design.

Of course, it should be recognized that the present invention is not limited to the double ended tuning fork described above and shown in FIGS. 3–5. For example, accelerometer 2 may incorporate a single beam or a variety of other mechanical resonator arrangements. However, a double ended tuning fork arrangement is generally preferred because beams 50, 52 can be driven laterally in opposite directions relative to each other. Driving beams 50, 52 in opposite directions minimizes the transfer of energy from the moving beams to the rest of the components in accelerometer 2, which increases the effectiveness of the transducer.

Transducers 22, 24 each further include an electrostatic drive for laterally vibrating beams 50, 52 at the resonance frequency. The electrostatic drive includes a pair of elongate electrodes 62, 64 located on either side of beams 50, 52, respectively. Electrodes 62, 64 are generally parallel to and laterally spaced from beams 50, 52 by a gap 66 (see FIG. 5). Electrodes 62, 64 are etched from active layer 31 and doped with a suitable conductive material to create the necessary charge carriers and to facilitate completion of the electrical circuit. Alternatively, electrodes 62, 64 may be formed from an electrically conductive material, such as gold, that is bonded to active layer 31.

As shown in FIGS. 1 and 3, each electrode 62, 64 is supported by a pair of support arms 68, 70 extending laterally away from beams. One of the support arms 68 on each electrode 62, 64 is coupled to a bonding pad 72 for electrically coupling electrodes 62, 64 to oscillation circuit 30 (see FIG. 5). Mounting pad 57 is coupled to an arm 53 that electrically couples beams 50, 52 to a bonding pad 59. Bonding pad 59 is suitably coupled to oscillation circuit 30 to complete the electrical circuit with electrodes 60, 62 and beams 50, 52. As shown in FIG. 2, substrate 32 may also include a bonding pad 61 for electrically connecting substrate 32 to ground. Bonding pads 59, 61 and 72 are formed from a suitable conductive material, such as gold.

FIGS. 4 and 5 illustrate a preferred embodiment of the present invention, in which beams 50, 52 each include a plurality of fingers 80 projecting outward from a lateral surface 81 of each beam 50, 52 toward the corresponding electrode 62, 64. Likewise, electrodes 62, 64 each include a plurality of fingers 82 projecting laterally inward so that beam fingers 80 and electrode fingers 82 are intermeshed with each other. Fingers 80, 82 are each sized so that their ends 84 will not contact beams 50, 52 or electrodes 62, 64 when beams 50, 52 are laterally vibrated relative to electrodes 62, 64. Usually, fingers 80, 82 will have a length of about 20 to 60 microns and preferably about 35 to 45 microns so that fingers 80, 82 overlap each other in the lateral direction by about 2–10 microns. Electrode fingers 82 and beam fingers 80 are axially spaced from each other by a suitable distance to provide electric capacitance therebetween. Usually, electrode and beam fingers 82, 80 will be spaced by about 2 to 10 microns from each other and preferably about 4 to 8 microns. Since beam fingers 80 are axially spaced from electrode fingers 82, the distance between these fingers will generally remain constant as beams 50, 52 vibrate in the lateral direction.

Electrostatic force is generally proportional to the square of the charge, which is proportional to the voltage and to the capacitance between the beam and the electrode. The capacitance is inversely proportional to the distance between the beam and the electrode. Accordingly, the electrostatic force is proportional to the square of the voltage and inversely proportional to the square of the distance between the beam and the electrode. Thus, changes in the distance between the beam and the electrode will typically change the electrostatic force. In fact, this change in the electrostatic force often acts as an electrical spring that works opposite to the elastic force or mechanical spring of the beams to lower the resonance frequency. For example, as the beam moves from its rest position closer to the electrode, the electrostatic force increases, the change in force working opposite to the elastic force of the beam. When the beam moves from its rest position away from the electrode, the electrostatic force decreases, so that the change in electrostatic force again works against the elastic restoring force of the beam. This lowers the resonance frequency of the beam by a factor related to the magnitude of the bias voltage. Accordingly, the resonant frequency of the beams is generally sensitive to changes in the bias voltage.

In the present invention, the distance between intermeshed beam and electrode fingers 80, 82 remains substantially constant as the beams 50, 52 vibrate relative to the stationary electrodes 62, 64. The electrostatic force between the beams and the electrodes is generally proportional to the change in capacitance with distance. Since the capacitance between the intermeshed electrode and beam fingers changes linearly with the motion of the beams, the electrostatic force will remain substantially constant as the beams move toward and away from the electrodes. Accordingly, the electrostatic force will remain substantially constant during vibration of beams 50, 52 and, therefore, will not work against the mechanical spring of the beams 50, 52 to lower the resonance frequency. Thus, the sensitivity to changes in bias voltage is decreased with the present invention. Applicant has found that this sensitivity is reduced by 5 to 10 times compared to a similar resonator that does not incorporate intermeshed fingers. Reducing the sensitivity of the resonance frequency to changes in bias voltage increases the accuracy of the vibratory force transducer. In addition, this allows the transducer to effectively operate with higher bias voltage levels, which results in a larger signal-to-noise ratio and requires less amplifier gain in the oscillator circuit. Usually, a bias voltage of about 5 to 100 Volts will be applied to electrodes 62, 64 and beams 50, 52 and preferably at least 50 Volts will be applied to the electrodes and beams.

Figure 6:
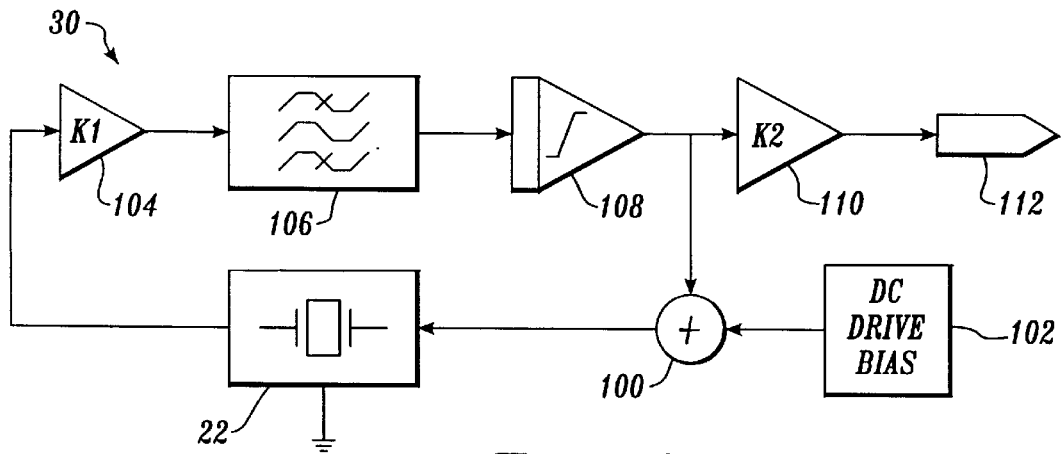
FIG. 6 is a block diagram of an electrical circuit for driving the transducer of FIG. 3.

FIG. 6 illustrates a representative oscillation circuit 30 in which vibrating beams 50, 52 of transducers 22, 24 function as a resonator. A transimpedance amplifier 104 converts a sense current received from vibrating beams 50, 52 to a voltage. This voltage is filtered by a bandpass filter 106, which reduces noise, and its amplitude is controlled by an amplitude limiter 108. The resulting signal is combined with the output or DC bias voltage from a DC source 102 in a summing junction 100. The DC bias voltage generates a force between electrodes 62, 64 and beam 50, 52. The signal from amplitude limiter 108 modulates this force causing beams 50, 52 to vibrate laterally at their resonant frequency. This lateral beam motion, in turn, generates the sense current. An output buffer 110 isolates the oscillator from external circuitry connected to an output 112 of oscillation circuit 30. The gain in oscillation circuit 30 sustains oscillation of beams 50, 52.

As shown in FIG. 1, forces applied to proof mass 18 will cause proof mass 18 to rotate about hinge axis 20. This rotation generates an axial force against transducers 22, 24. The axial force applied to transducers 22, 24 proportionally changes the vibration frequency of beams 50, 52 in each transducer 22, 24. To minimize changes in the vibration frequency of beams 50, 52 that are not related to the applied force, it is advantageous to have a relatively high velocity from the vibrational motion of beams 50, 52. The vibrational velocity is generally proportional to the resonance amplification factor (Q) and, therefore, it is generally considered beneficial to maximize the Q of vibratory transducers 22, 24. Typically, Q is maximized by partially evacuating accelerometer 2 to reduce damping of beams 50, 52. This is because the air between the moving beams 50, 52 and the electrodes 62, 64 damps the movement of beams 50, 52 toward electrodes 62, 64. On the other hand, it is also desirable to provide gas damping of proof mass 18 to minimize the vibration of proof mass 18 that is not related to an applied force. For example, if a force were applied to mass 18 in a vacuum or near vacuum, the mass 18 would continue to swing back and forth about inner flexures 14, 16 until it eventually slowed to a halt. Undesirable resonance can also be caused by vibrations in the surrounding environment (other than the applied force) that cause the proof mass to oscillate. Gas damping of proof mass 18 minimizes these undesirable oscillations.

Applicant has found that intermeshed beam and electrode fingers 80, 82 decease the damping of beams 50, 52 at pressures above vacuum on the order of 5 to 10 times. In fact, transducers 22, 24 of the present invention operate effectively in air having substantially higher pressure levels than vacuum (on the order 1/10 to 1 atmosphere). Applicant believes that this occurs because a portion of the air between beams 50, 52 and electrodes 62, 64 is located in the axial gaps between beam and electrode fingers 80, 82. Since fingers 80, 82 are not moving toward and away from each other, this portion of the air contributes substantially less to the damping of the beams 50, 52. Accordingly, transducers 22, 24 can be operated at atmospheric pressure, which allows proof mass 18 to be gas damped to minimize undesirable vibrations in the proof mass 18.

Referring to FIGS. 7A–7C, the method of manufacturing accelerometer 2 according to the present invention will now be described. An insulating layer of silicon oxide is first applied to substrate 32, active layer 31 or both. Preferably, an oxide layer 120 is epitaxially grown on substantially flat surfaces of silicon wafers 122, 124, as shown in FIG. 7A.

The silicon wafers 122, 124 are then placed together (see FIG. 7B), preferably by molecular bonding at elevated temperatures (e.g., on the order of about 300° C. to 500° C.) In a preferred configuration, portions of the silicon wafers 122, 124 will be removed after they have been bonded together to provide a substrate 32 having a thickness of about 300 to 700 micrometers, preferably about 400 to 600 micrometers, and a relatively thin active layer 31 of about 5 to 40 micrometers, preferably about 10 to 30 micrometers (see FIG. 7C).

Proof mass 18 and instrument frames 6, 8 are then etched into substrate 32 so that proof mass 18 is suspended from inner frame 8 by flexures 14, 16, and transducers 22, 24 are etched into active layer 31 (see FIGS. 1 and 2). Insulating layer 34 inhibits undesirable etching of transducers 22, 24 while the substrate 32 is being etched and vice versa. First and second parallel beams 50, 52 are etched, preferably with reactive ion etching, into the active layer 31. Electrodes 62, 64 are etched from active layer 31 and doped with a suitable conductive material to create the necessary charge carriers and to facilitate completion of the electrical circuit. After the accelerometers components are formed into the silicon wafers 122, 124, the beams 50, 52 are mechanically coupled to proof mass 18 and inner frame 8, and the electrodes 62, 64 are capacitively coupled to oscillator circuit 30.

Although the foregoing invention has been described in detail for purposes of clarity, it will be obvious that certain modifications may be practiced within the scope of the appended claims. For example, although the present invention is particularly useful for electrostatically driven resonators, it may also be used with other drive means, such as piezoelectric drives, electromagnetic drives, thermal drives or the like.

What is claimed is:

1. An accelerometer made from a process comprising:

applying an epitaxial insulating layer between a semiconducting substrate and a semiconducting active layer;

forming a frame and a proof mass in the substrate such that the proof mass is suspended from the frame by one or more flexures; and forming one or more vibratory force transducers in the active layer such that the transducers are coupled to the proof mass and the frame and are capable of detecting a force applied to the proof mass, said forming one or more vibratory force transducers further comprising:

etching first and second parallel beams in said active layer, each beam having first and second end portions and a resonating portion therebetween;

mechanically coupling the first end portions of the beams to the proof mass and the second end portions to the frame; and etching an electrode in said active layer, the electrode being positioned adjacent to and laterally spaced from the first beam;

etching one or more fingers extending laterally outward from the first beam; and etching one or more fingers projecting laterally inward from said electrode toward the first beam and intermeshed with the one or more fingers of the first beam;

wherein said insulating layer provides both electrical and mechanical insulation between said substrate and said active layer.

2. The accelerometer of claim 1, wherein applying an epitaxial insulating layer between a semiconducting substrate and a semiconducting active layer comprises:

providing first and second silicon wafers each having a substantially planar surface; and applying a silicon oxide layer on the planar surfaces of the first and second silicon wafers.

3. The accelerometer of claim 2, wherein applying an epitaxial insulating layer between a semiconducting substrate and a semiconducting active layer further comprises bonding the silicon oxide layers on the planar surfaces of the first and second silicon wafers together such that the silicon wafers are coupled to and insulated from each other.

4. The accelerometer of claim 2, wherein said applying a silicon oxide layer on the planar surfaces of the first and second silicon wafers comprises epitaxially growing silicon oxide onto the planar surfaces of the silicon wafers.

5. The accelerometer of claim 3, wherein said bonding comprises placing the silicon oxide layers together and applying heat.

6. The accelerometer of claim 5, wherein said silicon oxide layer is about 0.1 to 10 micrometers thick.

7. The accelerometer of claim 3, wherein applying an epitaxial insulating layer between a semiconducting substrate and a semiconducting active layer further comprises removing a portion of the silicon wafers such that the first silicon wafer has a thickness of about 300 to 700 micrometers and the second silicon wafer has a thickness of about 5 to 40 micrometers.

8. The accelerometer of claim 7, wherein forming a frame and a proof mass further comprises etching the first silicon wafer to form the proof mass and the frame, and forming one or more vibratory force transducers comprises etching the second silicon wafer to form a pair of vibratory force transducers.

9. The accelerometer of claim 8, wherein the active layer and the substrate each have surfaces opposite the planar surfaces, the accelerometer further comprising etching one or more flexure hinges to rotatably couple the proof mass to the frame, the flexure hinges being substantially centered between the opposite surfaces of the active layer and the substrate.

10. The accelerometer of claim 1, further comprising electrically coupling an oscillating circuit to the vibratory force transducers.

11. A method for manufacturing a force transducer comprising the steps of:

suspending a proof mass from a stationary frame on a semiconductor wafer;

mechanically coupling at least one vibratory force transducer to the proof mass and the frame, said coupling comprises fixing first end portions of first and second parallel beams to the suspended proof mass and fixing second end portions of first and second parallel beams to the stationary frame, positioning an electrode adjacent to and laterally spaced from the first beam, laterally extending one or more fingers outward from the first parallel beams, and laterally extending one or more fingers from the electrode adjacent to the first beam inwardly toward the first parallel beam and intermeshed with the one or more fingers of the first beam; and electrically insulating at least a portion of the vibratory force transducer from the semiconductor wafer.

12. The method of claim 11, further comprising applying a silicon oxide layer onto planar surfaces of first and second silicon wafers and bonding the silicon oxide layers together such that the silicon wafers are coupled to and insulated from each other.

13. The method of claim 12, further comprising etching the first silicon wafer to form the proof mass suspended from the frame by one or more flexure hinges and etching the second silicon wafer to form a pair of vibratory force transducers.

14. The method of claim 13, further comprising etching first and second parallel beams each having first and second end portions and a resonating portion therebetween, and first and second electrodes positioned adjacent to and laterally spaced from the first and second beams.

15. The method of claim 14, further comprising axially spacing a plurality of laterally projecting fingers on the beams from a plurality of laterally projecting fingers on the electrodes such that the beam fingers and the electrode fingers are spaced at a constant distance during lateral vibration of the beams.

16. A method for detecting an applied force comprising the steps of:

suspending a proof mass from a stationary frame on a semiconductor wafer;

mechanically coupling at least one vibratory force transducer to the proof mass and the frame, said coupling comprises fixing first end portions of first and second parallel beams to the suspended proof mass and fixing second end portions of first and second parallel beams to the stationary frame, positioning an electrode adjacent to and laterally spaced from the first beam, laterally extending one or more fingers outward from the first parallel beams, and laterally extending one or more fingers from the electrode adjacent to the first beam inwardly toward the first parallel beam and intermeshed with the one or more fingers of the first beam; and electrically insulating at least a portion of the vibratory force transducer from the semiconductor wafer transversely vibrating a resonating portion of the first parallel beam at a resonant frequency with the electrode;

applying an axial force to the beams in response to a force applied to the proof mass to vary a vibration frequency of the beam; and detecting the vibration frequency to determine the force applied to the proof mass.

* * * * *